(12) United States Patent
Hau-Riege et al.

(10) Patent No.: US 7,026,225 B1
(45) Date of Patent: Apr. 11, 2006

(54) SEMICONDUCTOR COMPONENT AND METHOD FOR PRECLUDING STRESS-INDUCED VOID FORMATION IN THE SEMICONDUCTOR COMPONENT

(75) Inventors: Christine Hau-Riege, Fremont, CA (US); Amit Marathe, Milpitas, CA (US); John Sanchez, Jr., Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 214 days.

(21) Appl. No.: 10/697,214

(22) Filed: Oct. 29, 2003

Related U.S. Application Data

(60) Provisional application No. 60/501,445, filed on Sep. 9, 2003.

(51) Int. Cl.
*H01L 21/4163* (2006.01)
*H01L 21/326* (2006.01)
*H01L 21/479* (2006.01)

(52) U.S. Cl. .................. 438/468; 438/618; 438/622

(58) Field of Classification Search ........... 438/468, 438/618, 619, 622; 257/758
See application file for complete search history.

(56) References Cited

U.S. PATENT DOCUMENTS

| | | | | |
|---|---|---|---|---|
| 5,517,062 A | * | 5/1996 | Lur et al. ............. | 257/760 |
| 5,739,587 A | * | 4/1998 | Sato .................. | 257/758 |
| 6,245,996 B1 | | 6/2001 | Atakov et al. ......... | 174/68.1 |
| 6,559,499 B1 | * | 5/2003 | Alers et al. ........... | 257/311 |
| 2001/0001427 A1 | | 5/2001 | Atakov et al. ......... | 174/113 R |

OTHER PUBLICATIONS

Ogawa, E.T., et al., Stress-Induced Voiding Under Vias Connected To Wide Cu Metal Leads.

* cited by examiner

*Primary Examiner*—William M. Brewster
(74) *Attorney, Agent, or Firm*—Rennie William Dover; Paul Drake

(57) ABSTRACT

A semiconductor component having a feature suitable for inhibiting stress induced void formation and a method for manufacturing the semiconductor component. A semiconductor substrate is provided having a major surface. A layer of dielectric material is formed over the major surface. A metallization system is formed over the layer of dielectric material, wherein the metallization system includes a portion having gaps or apertures which inhibit stress induced void formation.

18 Claims, 4 Drawing Sheets

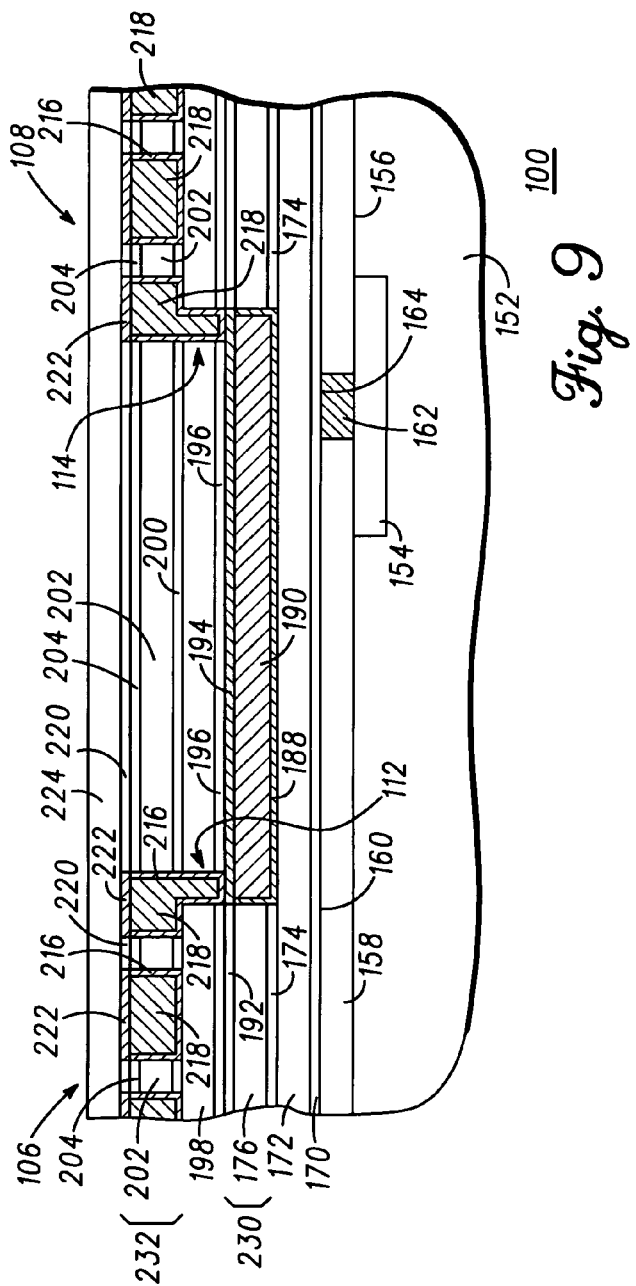
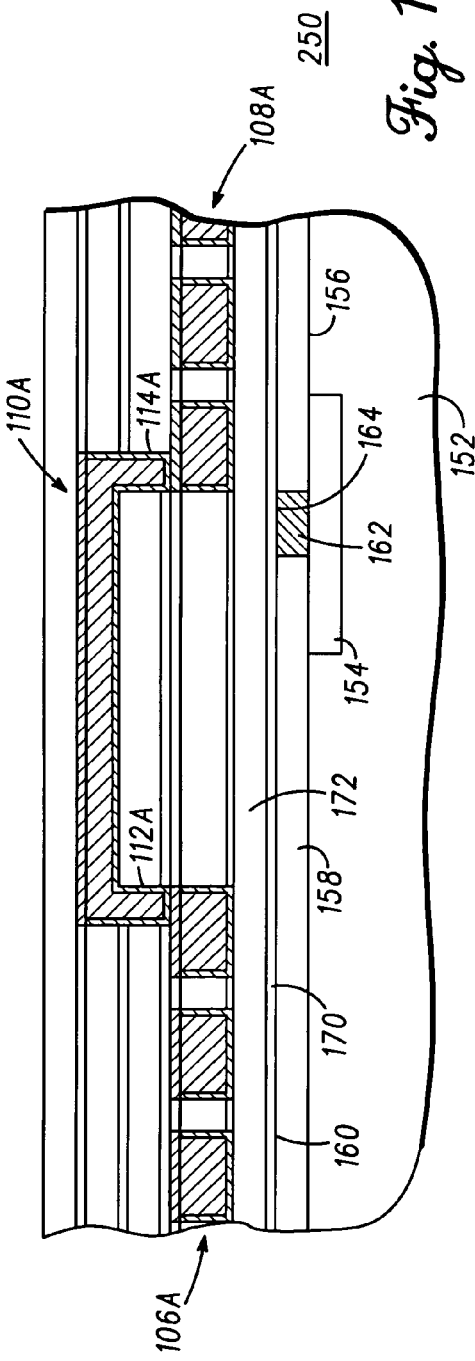

US 7,026,225 B1

SEMICONDUCTOR COMPONENT AND METHOD FOR PRECLUDING STRESS-INDUCED VOID FORMATION IN THE SEMICONDUCTOR COMPONENT

This application claims the benefit of U.S. Provisional Application No. 60/501,445 filed Sep. 9, 2003.

FIELD OF THE INVENTION

The present invention relates, in general, to semiconductor components and, more particularly, to metallization systems suitable for use in semiconductor components.

BACKGROUND OF THE INVENTION

Semiconductor component manufacturers are constantly striving to increase the speed of their components. Because a semiconductor component, such as a microprocessor, contains up to a billion transistors or devices, the focus for increasing speed has been to decrease gate delays of the semiconductor devices that make up the semiconductor component. As a result, the gate delays have been decreased to the point that speed is now primarily limited by the propagation delay of the metallization system used to interconnect the semiconductor devices with each other and with elements external to the semiconductor component. Metallization systems are typically comprised of a plurality of interconnect layers vertically separated from each other by a dielectric material and electrically coupled to each other by metal-filled vias or conductive plugs. Each layer contains metal lines, metal-filled vias, or combinations thereof separated by an insulating material. FIG. 1 is a top view of a portion of a prior art metallization system 12 formed in a semiconductor component 10. Metallization system 12 includes a continuous or gap-free input interconnect 14 coupled to a continuous or gap-free output interconnect 16 by a routing interconnect 18. Routing interconnect 18 is a portion of an interconnect layer in a plane either above or below the plane in which input and output interconnects 14 and 16, respectively, are formed. One end of routing interconnect 18 is coupled to a corresponding end of input interconnect 14 by a metal filled via 20 and an opposing end of routing interconnect 18 is coupled to a corresponding end of output interconnect 16 by a metal filled via 22. The width $W_1$ of input and output interconnects 14 and 16, respectively, is much larger than the width $W_2$ of routing interconnect 18. When used for signal transmission, current flows from input interconnect 14 through routing interconnect 18 then through output interconnect 16.

Metallization system 12 is also suitable for use as an electromigration test structure. Because the widths of input and output interconnects 14 and 16, respectively, are greater than the width of routing interconnect 18, the current density in routing interconnect 18 is greater than the current density in interconnects 14 and 16. Thus, electromigration failures occur in routing interconnect 18 rather than in interconnects 14 and 16. Although useful for electromigration analysis, when metallization system 12 is used as either a signal transmission structure or a test structure, the large widths of the input and output interconnects induces the formation of stress voids in these portions of the metallization system. The stress voids tend to collect near vias, resulting in increased interconnect resistance, formation of open circuits, decreased yield, and decreased reliability.

Accordingly, what is needed is a metallization system that inhibits the formation of stress induced voids, a method for precluding stress induced void formation in a semiconductor component, and a method for manufacturing a semiconductor component that includes a stress-induced void-preclusion feature.

SUMMARY OF THE INVENTION

The present invention satisfies the foregoing need by providing a method for precluding stress-induced void formation in a portion of a semiconductor component. In accordance with one aspect, the method includes providing a semiconductor substrate. A void preclusion feature is formed in a first portion of a metallization system, wherein the first portion of the metallization system is disposed over the semiconductor substrate.

In accordance with another aspect, the present invention includes a method for manufacturing a metallization system, which metallization system is capable of precluding stress induced void formation in a portion therein. A first portion of a conductive interconnect is disposed over a semiconductor substrate, wherein the first portion has a width. The method further includes forming a plurality of apertures or gaps in the first portion of the conductive interconnect.

In accordance with yet another aspect, the present invention comprises a semiconductor component that includes a metallization system having a stress-induced void-preclusion feature. The semiconductor component comprises a semiconductor substrate having a layer of dielectric material disposed thereover. A first portion of a metallization system is disposed over the layer of dielectric material, wherein the first portion is in a first plane and has at least one aperture.

BRIEF DESCRIPTION OF THE DRAWINGS

The present invention will be better understood from a reading of the following detailed description, taken in conjunction with the accompanying drawing figures, in which like reference numbers designate like elements and in which:

FIGS. 3–9 are enlarged cross-sectional side views along section line 3—3 of the semiconductor component of FIG. 2 during manufacture in accordance with an embodiment of the present invention; and FIG. 10 is an enlarged cross-section side view of a semiconductor component in accordance with another embodiment of the present invention.

DETAILED DESCRIPTION

Generally, the present invention provides a semiconductor component having a means for precluding stress-induced void formation, a method for manufacturing the semiconductor component, a method for manufacturing the metallization system, and a method for mitigating stress-induced void formation. In accordance with one aspect, the semiconductor component includes a metallization system having a portion comprising a layer of metal with gaps or slots formed therein. This portion is also referred to as an input or input feeder portion. The input feeder portion is coupled to another portion of the metallization system that has a width less than or narrower than that of the input feeder portion. The portion having the narrower width is also referred to as a signal transmission or router portion. Optionally, the signal transmission portion is coupled to another feeder portion for further transmission of electrical signals in the semiconductor component. In an embodiment where the metallization system is used as a test structure, the signal transmission portion may be referred to as a test portion.

The gaps in the feeder portions are areas devoid of metal that serve as stress-induced void-inhibition features for inhibiting grain growth within the metallization system during operation. Grain growth inhibition inhibits the supersaturation of vacancies and the resultant voiding in the metallization system. Inhibiting void formation mitigates an increase in the resistance of the metallization system and the formation of open circuits within the metallization system.

Figure 1:
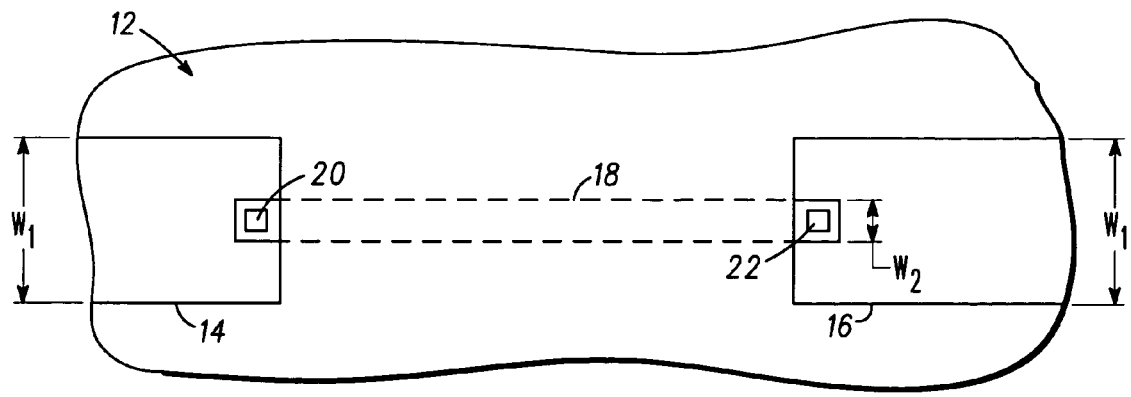
FIG. 1 is a top view of a prior art metallization system for use in a semiconductor component.
Figure 2:
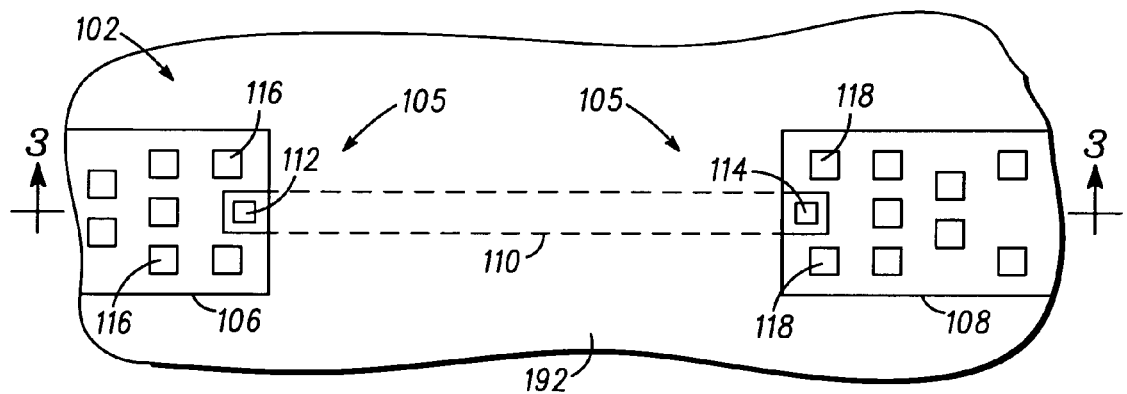
FIG. 2 is a top view of a metallization system for use in a semiconductor component in accordance with an embodiment of the present invention.

FIG. 2 is a top view of a portion of a semiconductor component 100 having a metallization system 102 in accordance with an embodiment of the present invention. What is shown in FIG. 2 is a dielectric material 192 having interconnect elements or portions 106 and 108 of an electrical interconnect 105 disposed thereon. Interconnect element 106 is coupled to interconnect element 108 by an interconnect element or portion 110. More particularly, one end of interconnect element 106 is coupled to one end of interconnect element 110 by a metal-filled via 112 and the other end of interconnect element 110 is coupled to an end of interconnect element 108 by a metal-filled via 114. In accordance with this embodiment, interconnect elements 106 and 108 are in substantially the same plane, i.e., they are substantially co-planar, whereas interconnect element 110 is in a plane below that of interconnect elements 106 and 108. Because interconnect element 110 is in a plane below that of interconnect elements 106 and 108, it is covered by dielectric material 192. Thus, interconnect element 110 is shown by broken lines. In an alternative embodiment, interconnect element 110 is in a plane above that of interconnect elements 106 and 108. In the alternative embodiment, interconnect elements 106 and 108 would be covered by a different dielectric layer than dielectric layer 192. An example of this alternative embodiment is shown in FIG. 10. In yet another alternative embodiment, interconnect element 110 is in the same plane as interconnect elements 106 and 108.

Interconnect element 106 has a plurality of void inhibition structures 116 formed therein. By way of example void inhibition structures 116 are gaps or apertures formed in interconnect element 106. Void inhibition structures are also referred to as void preclusion features and are preferably portions of interconnect element 106 from which an electrically conductive material such as metal is absent. Although it is preferable that metal is absent from the gaps, it should be understood that the gaps may be filled with metal or with a dielectric material, such as for example, oxide, nitride, polyimide, etc. Similarly, interconnect element 108 has a plurality of void inhibition structures 118 formed therein. Although void inhibition structures 116 and 118 are shown as being squares, it should be understood this is not a limitation of the present invention. Other suitable shapes for inhibition structures 116 and 118 include, but are not limited to, circles, half-circles, ellipses, and polygonal shapes such as, for example, triangles, rectangles, pentagons, hexagons, heptagons, octagons, or the like. Further, the pattern or distribution of void inhibition structures 116 and 118 is not a limitation of the present invention. In other words, the pattern of void inhibition structures 116 and 118 formed in interconnect elements 106 and 108 is not limited to that shown in FIG. 2.

Figure 3:
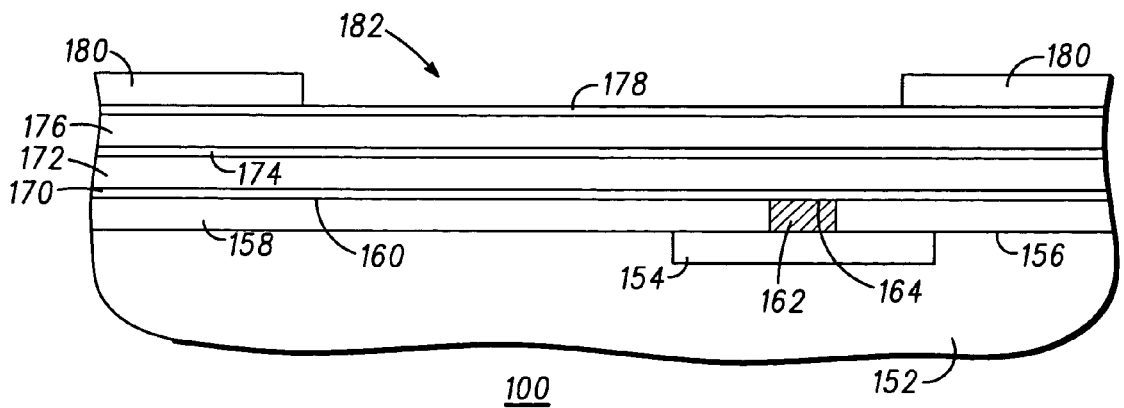

FIG. 3 is an enlarged cross-sectional side view of semiconductor component 100 along section line 3—3 of FIG. 2 during an intermediate stage of manufacture in accordance with an embodiment of the present invention. What is shown in FIG. 3 is a portion of a semiconductor substrate 152 in which a semiconductor device 154 has been fabricated. Semiconductor substrate 152 has a major surface 156. It should be understood that semiconductor device 154 has been shown in block form and that the type of semiconductor device and the number of semiconductor devices are not limitations of the present invention. Suitable semiconductor devices include active elements such as, for example, insulated gate field effect transistors, complementary insulated gate field effect transistors, junction field effect transistors, bipolar junction transistors, diodes, passive elements such as, for example, capacitors, resistors, and inductors, and combinations of active elements, passive elements, or both. Likewise, the material of semiconductor substrate 152 is not a limitation of the present invention. Substrate 152 can be silicon, Silicon-On-Insulator (SOI), Silicon-On-Sapphire (SOS), silicon germanium, germanium, an epitaxial layer of silicon formed on a silicon substrate, or the like. In addition, semiconductor substrate 152 may be a compound semiconductor material such as gallium-arsenide, indium-phosphide, or the like.

A layer of dielectric material 158 having a major surface 160 is formed on semiconductor substrate 152 and an electrical contact 162 having a major surface 164 is formed in a portion of dielectric material 158. Preferably, dielectric layer 158 is silicon dioxide ($SiO_2$) having a thickness ranging between approximately 1,000 Angstroms (Å) and approximately 20,000 Å. The combination of dielectric material 158 and electrical contact 162 is referred to as an interconnect layer. When electrical contact 162 is metal, the interconnect layer is also referred to as a metal interconnect layer or a conductive level. Techniques for forming semiconductor devices such as device 154, dielectric material 158, and electrical contact 162 are known to those skilled in the art.

An etch stop layer 170 having a thickness ranging between approximately 5 Å and approximately 1,000 Å is formed on dielectric layer 158. By way of example, etch stop layer 170 has a thickness of 500 Å. Suitable materials for etch stop layer 170 include dielectric materials such as, for example, silicon oxynitride (SiON), silicon nitride ($Si_xN_y$), silicon rich nitride ($Si_xRN_y$), silicon carbide (SiC), hydrogenated oxidized silicon carbon material (SiCOH), or the like.

A layer of dielectric or insulating material 172 having a thickness ranging between approximately 1,000 Å and approximately 20,000 Å is formed on etch stop layer 170. By way of example, dielectric layer 172 has a thickness of about 10,000 Å and comprises a material having a dielectric constant (κ) lower than that of, for example, silicon dioxide, silicon nitride, silicon rich nitride, silicon carbide, or hydrogenated oxidized silicon carbon material, i.e., the material of dielectric layer 172 is a low κ dielectric material. Using low κ dielectric materials for dielectric layer 172 lowers the capacitance of the metallization system and improves the performance of semiconductor component 100. Low κ dielectric material 172 can be an organic material or an inorganic material. Suitable organic low κ dielectric materials include, but are not limited to, polyimide, spin-on polymers, poly(arylene ether) (PAE), parylene, xerogel, fluorinated aromatic ether (FLARE), fluorinated polyimide (FPI), dense SiLK, porous SiLK (p-SiLK), polytetrafluoroethylene, and benzocyclobutene (BCB). Suitable inorganic low K dielectric materials include, but are not limited to, hydrogen silsesquioxane (HSQ), methyl silsesquioxane (MSQ), fluorinated glass, or NANOGLASS. It should be understood that the type of dielectric material for dielectric layer 172 is not a limitation of the present invention and that other organic and inorganic dielectric materials may be used. Similarly, the method for forming dielectric layer 172 is not limitation of the present invention. For example, dielectric layer 172 may be formed using, among other techniques, spin-on coating, spray-on coating, Chemical Vapor Deposition (CVD), Plasma Enhanced Chemical Vapor Deposition (PECVD), Physical Vapor Deposition (PVD), sputter deposition, reactive sputter deposition, ion-beam deposition, or the like.

An etch stop layer 174 having a thickness ranging between approximately 5 Å and approximately 1,000 Å is formed on dielectric layer 172. By way of example, etch stop layer 174 has a thickness of 500 Å. Suitable materials for etch stop layer 174 include dielectric materials such as, for example, silicon oxynitride, silicon nitride, silicon rich nitride, silicon carbide, hydrogenated oxidized silicon carbon material, or the like. It should be noted that etch stop layer 174 is an optional layer. In other words, etch stop layer 174 may be absent from semiconductor component 100.

A layer of dielectric material 176 having a thickness ranging from approximately 1,000 Å to approximately 20,000 Å is formed on etch stop layer 174. Suitable materials and deposition techniques for forming dielectric layer 176 are described with reference to dielectric layer 172. Preferably, the material of dielectric layer 176 is the same as that of dielectric layer 172. If the material of dielectric layer 176 is different from that of dielectric layer 172, it is preferable that the materials of dielectric layers 176 and 172 have similar coefficients of thermal expansion and be capable of withstanding the stress levels brought about by semiconductor processing and use as a final product. By way of example, the dielectric material of dielectric layer 172 is p-SILK and the material of dielectric layer 176 is silicon oxynitride. These materials can be applied using a spin-on coating technique and they have similar stress level tolerances and processing temperature tolerances. Moreover, these materials can be selectively or differentially etched with respect to each other. In other words, etchants are available that selectively etch the p-SILK and silicon oxynitride, i.e., an etchant can be used to etch the p-SILK but not significantly etch the silicon oxynitride and another etchant can be used to etch the silicon oxynitride but not significantly etch the p-SILK. This is beneficial when etch stop layer 174 is absent. Although these embodiments illustrate the use of an organic and an inorganic dielectric material in combination, this is not a limitation of the present invention. The dielectric materials of dielectric layer 172 and dielectric layer 176 can be organic materials, inorganic materials, or a combination thereof.

Still referring to FIG. 3, a hardmask 178 having a thickness ranging between approximately 100 Å and approximately 5,000 Å is formed on dielectric layer 176. Preferably, hardmask 178 has a thickness ranging between approximately 500 Å and approximately 1,000 Å and comprises a single layer of a dielectric material such as for example, silicon oxynitride, silicon nitride, silicon rich nitride, silicon carbide, hydrogenated oxidized silicon carbon material, or the like. It should be noted that hardmask 178 is not limited to being a single layer system, but can also be a multi-layer system. Preferably, hardmask 178 comprises a material having a different etch rate or selectivity and a different thickness than etch stop layers 170 and 174. A layer of photoresist 180 is formed on hardmask 178 and patterned to form an opening 182 using techniques known to those skilled in the art. Because hardmask 178 lowers the reflection of light during the photolithography steps used in patterning photoresist layer 180, it is also referred to as an Anti-Reflective Coating (ARC) layer.

Figure 4:
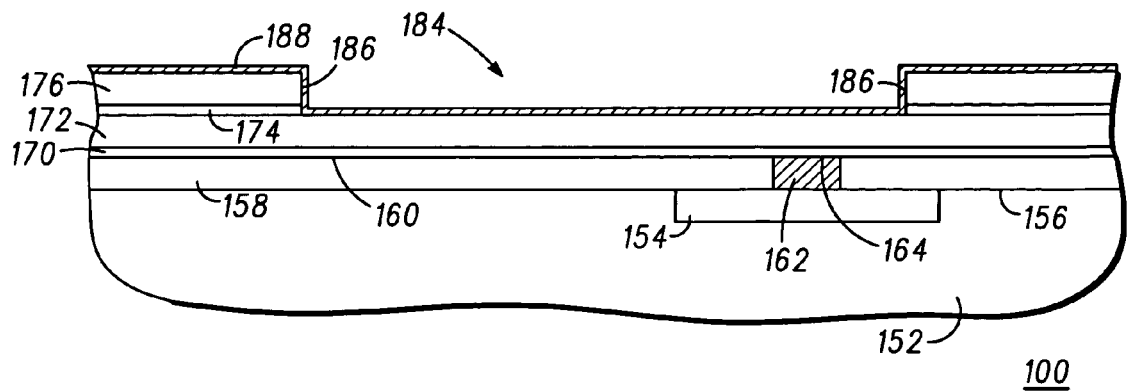

Referring now to FIG. 4, the portions of hardmask 178 and dielectric layer 176 that are not protected by patterned photoresist layer 180, i.e., the portions exposed through opening 182, are etched using an anisotropic reactive ion etch to form an opening 184 having sidewalls 186. The anisotropic etch stops or terminates in or on etch stop layer 174. In other words, the portions of hardmask 178 and dielectric layer 176 underlying or exposed through opening 184 are removed using the anisotropic reactive ion etch, thereby exposing a portion of etch stop layer 174. Photoresist layer 180 is removed using techniques known to those skilled in the art.

The exposed portion of etch stop layer 174 is etched using a reactive ion etch to expose a portion of dielectric layer 172. In accordance with the present embodiment, the etching of etch stop layer 174 also etches hardmask 178, thereby exposing dielectric layer 176. It should be understood this is not a limitation of the present invention and that the etch step may not affect hardmask 178 or it may thin hardmask 178 but leave a portion of hardmask 178 over dielectric layer 176. Preferably, photoresist layer 180 is removed prior to exposing dielectric layer 172 because low κ dielectric materials that may comprise dielectric layer 172 are sensitive to photoresist removal processes and may be damaged by them.

Still referring to FIG. 4, opening 184 and dielectric layer 176 are lined with a barrier layer 188 having a thickness ranging between approximately 200 Å and approximately 350 Å. By way of example, barrier layer 188 is a tantalum layer formed using Chemical Vapor Deposition (CVD), Plasma Enhanced Chemical Vapor Deposition (PECVD), sputtering, evaporation, or the like. Layer 188 serves as a barrier layer to prevent diffusion from a subsequently deposited metal into other regions of semiconductor component 100 such as, for example, dielectric layers 172 and 176 or into semiconductor device 154. Other suitable materials for barrier layer 188 include titanium (Ti), titanium nitride (TiN), tantalum nitride (TaN), a tantalum (Ta) and tantalum nitride (TiN) combination, tungsten (W), tungsten nitride (WN), titanium silicon nitride (TiSiN), and refractory metal compounds such as refractory metal nitrides, refractory metal carbides, or refractory metal borides.

Figure 5:
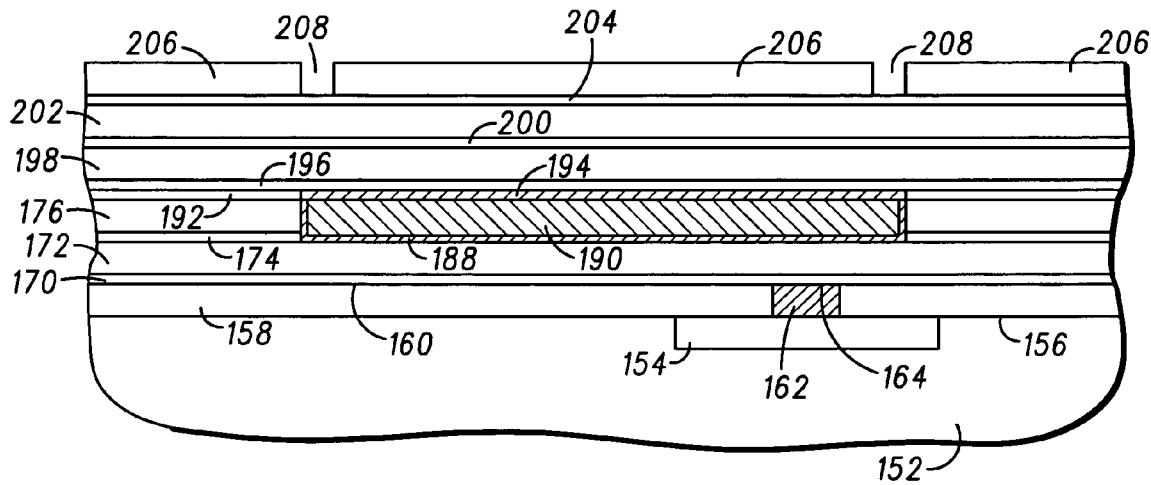

Referring now to FIG. 5, a film or layer of an electrically conductive material 190 having a thickness ranging between approximately 1,000 Å and approximately 20,000 Å is formed on barrier layer 188. By way of example, layer 190 is copper which is plated on barrier layer 188. Techniques for plating copper on a barrier layer are known to those skilled in the art. Alternatively, layer 190 may be aluminum or silver. Copper layer 190 is planarized using chemical mechanical planarization. The technique for planarizing copper layer 190 is not a limitation of the present invention. Other suitable planarization techniques include electropolishing, electrochemical polishing, chemical polishing, and chemical enhanced planarization.

An etch stop layer 192 having a thickness ranging between approximately 5 Å and approximately 1,000 Å is formed on dielectric layer 176 and copper layer 190. By way of example, etch stop layer 192 has a thickness of 500 Å. Suitable materials for etch stop layer 192 include dielectric materials such as, for example, silicon oxynitride, silicon nitride, silicon rich nitride, silicon carbide, hydrogenated oxidized silicon carbon material, or the like.

A layer of photoresist (not shown) is patterned on etch stop layer 192 to expose portions of etch stop layer 192 that are over copper layer 190. The exposed portions of etch stop layer 192 are anisotropically etched to expose copper layer 190. A barrier layer 194 having a thickness ranging between approximately 200 Å and approximately 350 Å is formed on copper layer 190. Barrier layer 194 may be made using the same processing techniques described with reference to barrier layer 188. Barrier layer 194 and etch stop layer 192 are planarized using techniques known to those skilled in the art. Barrier layer 194 prevents diffusion of the copper atoms from copper layer 190 into other portions of semiconductor component 100.

An etch stop layer 196 having a thickness ranging between approximately 5 Å and approximately 1,000 Å is formed on dielectric layer 192 and barrier layer 194. By way of example, etch stop layer 196 has a thickness of 500 Å. Suitable materials for etch stop layer 196 include dielectric materials such as, for example, silicon oxynitride, silicon nitride, silicon rich nitride, silicon carbide, hydrogenated oxidized silicon carbon material, or the like.

A layer of dielectric material 198 having a thickness ranging from approximately 1,000 Å to approximately 20,000 Å is formed on etch stop layer 196. Suitable materials and deposition techniques for forming dielectric layer 198 are the same as those described with reference to dielectric layers 172 and 176. Preferably, the material of dielectric layer 198 is the same as that of dielectric layers 172 and 176. If the material of dielectric layer 198 is different from that of layer 172 or layer 176, it is preferable that the materials of dielectric layers 198, 176, and 172 have similar coefficients of thermal expansion and be capable of withstanding the stress levels brought about by processing and use as a final product.

Still referring to FIG. 5, an etch stop layer 200 having a thickness ranging between approximately 5 Å and approximately 1,000 Å is formed on dielectric layer 198. Preferably, etch stop layer 200 has a thickness of 500 Å. Suitable materials for etch stop layer 200 include dielectric materials such as, for example, silicon oxynitride, silicon nitride, silicon rich nitride, silicon carbide, hydrogenated oxidized silicon carbon material, or the like.

A layer of dielectric material 202 having a thickness ranging from approximately 1,000 Å to approximately 20,000 is formed on etch stop layer 200. Suitable materials and deposition techniques for forming dielectric layer 202 are the same as those described with reference to dielectric layers 172, 176, and 198.

A hardmask 204 having a thickness ranging between approximately 100 Å and approximately 5,000 Å is formed on dielectric layer 202. Preferably, hardmask 204 has a thickness ranging between approximately 500 Å and approximately 1,000 Å and comprises a single layer of a dielectric material such as for example, silicon oxynitride, silicon nitride, silicon rich nitride, silicon carbide, hydrogenated oxidized silicon carbon material, or the like. It should be noted that hardmask 204 is not limited to being a single layer system, but can also be a multi-layer system. Preferably hardmask 204 comprises a material having a different etch rate or selectivity and a different thickness than etch stop layers 200 and 196. A layer of photoresist 206 is formed on hardmask 204 and patterned to form openings 208 using techniques known to those skilled in the art. Because hardmask 204 lowers the reflection of light during the photolithography steps used in patterning photoresist layer 206, it is also referred to as an Anti-Reflective Coating (ARC) layer.

Figure 6:
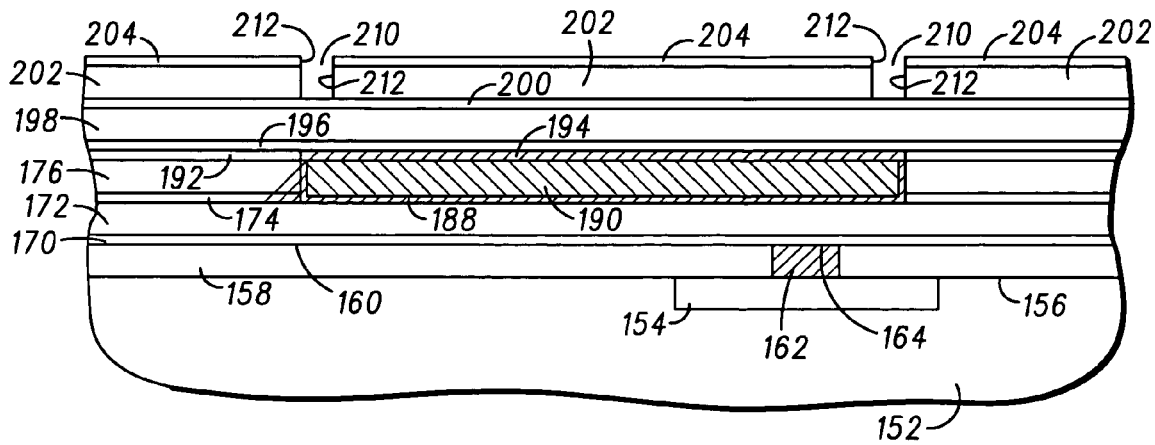

Referring now to FIG. 6, the portions of hardmask 204 and dielectric layer 202 that are not protected by patterned photoresist layer 206, i.e., the portions exposed through openings 208, are etched using an anisotropic reactive ion etch to form openings 210 having sidewalls 212. The anisotropic etch stops or terminates in or on etch stop layer 200. In other words, the portions of hardmask 204 and dielectric layer 202 underlying or exposed through openings 210 are removed using the anisotropic reactive ion etch, thereby exposing a portion of etch stop layer 200. Photoresist layer 206 is removed using techniques known to those skilled in the art.

Figure 7:
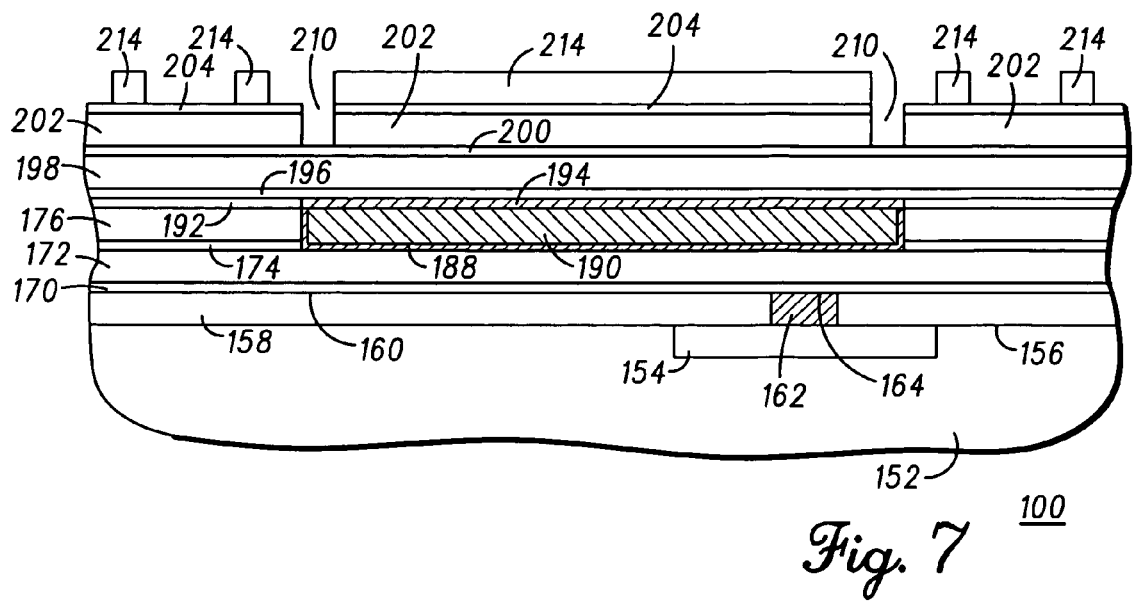

Referring now to FIG. 7, a layer of photoresist 214 is formed on hardmask 204 and patterned to expose openings 210 and portions of hardmask 204 using techniques known to those skilled in the art.

Figure 8:
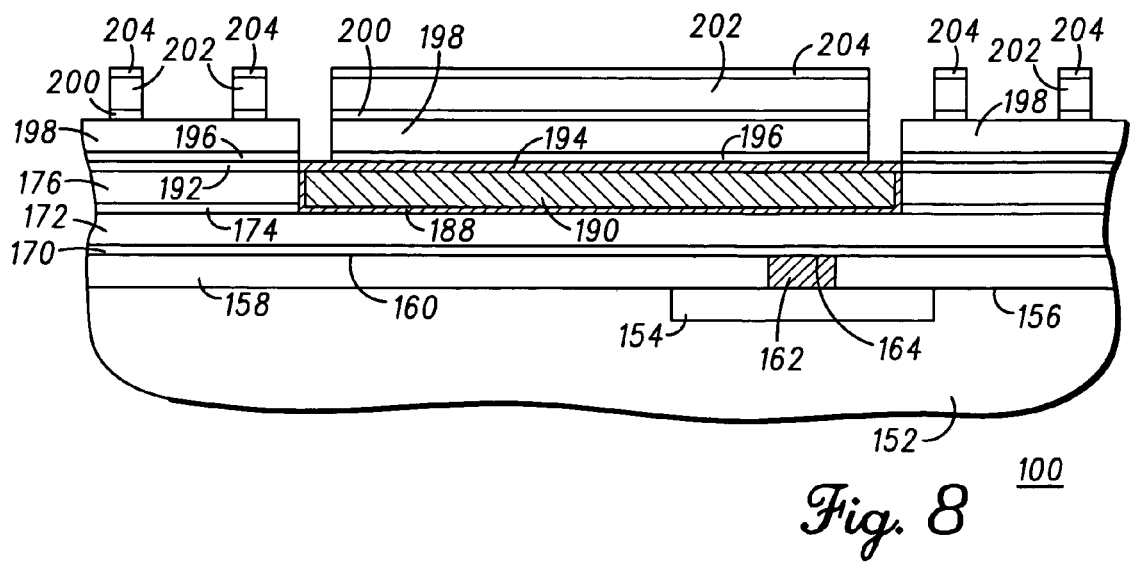

Referring now to FIG. 8, the portions of hardmask 204 and etch stop layer 200 that are not protected by patterned photoresist layer 214, i.e., the exposed portions, are etched using an anisotropic reactive ion etch to expose portions of dielectric layers 202 and 198. The anisotropic etch stops or terminates in or on etch stop layer 196 and the newly exposed portion of etch stop layer 200. Photoresist layer 214 is removed using techniques known to those skilled in the art.

The exposed portions of etch stop layers 200 and 196 are etched using an anisotropic reactive ion etch to expose portions of dielectric layer 198 and barrier layer 194. The anisotropic etch forms openings in dielectric layers 196, 198, 200, 202, and 204. The portions of layers 200, 202, and 204 that remain form dielectric pillars or mesas, which are also referred to as the remaining portions of the layer of dielectric material adjacent the openings.

Referring now to FIG. 9, the exposed portions of dielectric layer 198, barrier layer 194 and hardmask 204 are lined with a barrier layer 216 having a thickness ranging between approximately 200 Å and approximately 350 Å. By way of example, barrier layer 216 is a tantalum layer formed using Chemical Vapor Deposition (CVD), Plasma Enhanced Chemical Vapor Deposition (PECVD), sputtering, evaporation, or the like. Layer 216 serves as a barrier layer to prevent diffusion from a subsequently deposited metal into other regions of semiconductor component 100 such as, for example, dielectric layers 172, 178, 198, and 202 or into semiconductor device 154. Other suitable materials for barrier layer 216 include titanium, titanium nitride, tantalum nitride, a tantalum and tantalum nitride combination, tungsten, tungsten nitride, titanium silicon nitride, and refractory metal compounds such as refractory metal nitrides, refractory metal carbides, or refractory metal borides.

A film or layer of an electrically conductive material 218 is formed on barrier layer 216. By way of example, layer 218 is copper which is plated on barrier layer 216. Techniques for plating copper on a barrier layer are known to those skilled in the art. Alternatively, layer 218 may be aluminum or silver. Copper layer 218 is planarized using chemical mechanical planarization. The technique for planarizing copper layer 218 is not a limitation of the present invention. Other suitable planarization techniques include electropolishing, electrochemical polishing, chemical polishing, and chemical enhanced planarization.

An etch stop layer 220 having a thickness ranging between approximately 5 Å and approximately 1,000 Å is formed on hardmask 204 and the remaining portions of barrier layer 216 and copper layer 218. By way of example, etch stop layer 220 has a thickness of 500 Å. Suitable materials for etch stop layer 220 include dielectric materials such as, for example, silicon oxynitride, silicon nitride, silicon rich nitride, silicon carbide, hydrogenated oxidized silicon carbon material, or the like.

A layer of photoresist (not shown) is patterned to expose portions of etch stop layer 220 that are over the remaining portions of barrier layer 216 and copper layer 218. The exposed portions of etch stop layer 220 are anisotropically etched to expose the remaining portions of barrier layer 216 and copper layer 218. A barrier layer 222 having a thickness ranging between approximately 200 Å and approximately 350 Å is formed on the remaining portions of barrier layer 216 and copper layer 218. Barrier layer 222 may be made using the same processing techniques and the same material as those used for barrier layer 216. Barrier layer 222 is planarized so that portions remain that are co-planar with etch stop layer 220. Barrier layer 222 prevents diffusion of the electrically conductive material of layer 218, e.g., copper, into other portions of semiconductor component 100.

A layer of dielectric material 224 having a thickness ranging from approximately 500 Å to approximately 5,000 Å is formed on etch stop layer 220 and the remaining portions of barrier layer 222. Suitable materials and deposition techniques for forming dielectric layer 224 are the same as those described with reference to dielectric layers 172, 176, 198, and 202. Preferably, the material of dielectric layer 224 is the same as that of dielectric layers 172, 176, 198, and 202.

Thus, semiconductor component 100 has a metallization system comprising an interconnect layer 230 that comprises dielectric layers 174, 176, and 192 and electrically conductive layers 188, 190, and 194. In accordance with the embodiment shown in FIGS. 3–9, interconnect layer 230 includes dielectric layers, i.e., layers 174, 178, and 192, which have a signal interconnect structure 110 (see FIG. 2) formed therein. Signal interconnect structure 110 comprises copper layer 190 separated from dielectric layers 174, 178, and 192 by barrier layers 188 and 194. In addition, an interconnect layer 232 includes dielectric layers, i.e., layers 200, 202, 204 and 220, which have interconnect elements 106 and 108 (see FIG. 2) formed therein. Interconnect elements 106 and 108 comprise copper layer 218 separated from dielectric layer 200, 202, 204, and 220 by barrier layers 216 and 222. Interconnect element 106 is coupled to signal interconnect structure 110 through barrier-lined copper-filled via 112 and interconnect element 108 is coupled to signal interconnect structure 110 through barrier-lined copper-filled via 114. Thus, signal interconnect structure 110 is vertically positioned between semiconductor substrate 152 and interconnect elements 106 and 108.

Referring now to FIG. 10, an enlarged cross-section side view of a semiconductor component 250 in accordance with another embodiment of the present invention is shown. Like semiconductor component 100, semiconductor component 250 includes a semiconductor substrate 152 having a semiconductor device 154 formed therefrom and a plurality of dielectric layers and electrically conductive layers formed thereover. More particularly, semiconductor component 250 includes dielectric layers 158, 170, 172, 174, 176, 192, 196, 198, 216, and 220. However, rather than forming the signal transmission structure 110A to be vertically positioned between semiconductor substrate 152 and interconnect elements 106A and 108A, interconnect elements 106A and 108A are formed to be vertically positioned between the signal transmission structure 110A and semiconductor substrate 152. Similar to the metallization system of FIGS. 3–9, interconnect element 106A is coupled to signal interconnect structure 110A through barrier-lined copper-filled via 112A and interconnect element 108A is coupled to signal interconnect structure 110A through barrier-lined copper-filled via 114A. Thus, the interconnect layer having the stress-induced void-inhibition structures or features is formed to be vertically positioned between the interconnect layer having the signal transmission structure and the semiconductor substrate. It should be understood that for the sake of clarity, the letter "A" has been appended to the reference numbers denoting the signal interconnect structure, the interconnect elements, and the copper-filled vias to distinguish the embodiment shown and described with reference to FIG. 10 and that shown and described with reference to FIGS. 3–9.

By now it should be appreciated that a semiconductor component having a metallization system with stress-induced void-inhibition structures, a method for manufacturing the semiconductor component, and a method for manufacturing the metallization system having the void inhibition structures have been provided. An advantage of the present invention is that the void inhibition structures inhibit the formation of stress induced voids in the metallization system, thereby improving the reliability of the semiconductor component. Another advantage of the present invention is that it is suitable for integration into high performance semiconductor manufacturing processes.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law. For example, rather than using a damascene process or a damascene-like process to form the interconnect layers having the stress-induced void-inhibition features, these features can be formed by depositing a layer of metal over a dielectric layer and etching the metal layer to form a signal transmission interconnect layer. Then a layer of dielectric material is formed over the signal transmission interconnect layer and vias are formed therein. Feeder portions are formed from a metal layer that is disposed on the dielectric layer. The feeder portions fill the vias and are coupled to each other by the signal transmission interconnect layer. After forming the feeder portions, stress-induced void-inhibition features are formed therein by etching openings in the metal layer. Alternatively, the feeder portions can be formed from a metal layer. Stress-induced void-inhibition features are then formed in the feeder portions. A layer of dielectric material is formed over the feeder portions and a signal transmission interconnect layer is formed over the layer of dielectric material to couple the feeder portions to each other.

What is claimed is:

1. A method for precluding stress-induced void formation in a semiconductor component, comprising:
   providing a semiconductor substrate;
   forming a first portion of a metallization system above the semiconductor substrate, the first portion vertically spaced apart from the semiconductor substrate by a first distance, wherein forming the first portion includes:
   forming a first layer of dielectric material over the semiconductor substrate;
   forming a first opening in the first layer of dielectric material, the first opening having a surface, wherein at least one dielectric protrusion extends from the surface of the first opening;
   forming a second opening in the first layer of dielectric material, the second opening having a surface, wherein at least one dielectric protrusion extends from the surface of the second opening; and
forming an electrically conductive material in the first and second openings; and
forming a second portion of the metallization system, the second portion coupled to the first portion and vertically spaced apart from the semiconductor substrate by a second distance, the second distance different from the first distance, wherein said at least one dielectric protrusion extends from the first layer of dielectric material only from the bottom of the at least one dielectric protrusion.

2. The method of claim 1, wherein forming the first and second openings includes using an anisotropic reactive ion etch to form the first and second openings.

3. The method of claim 1, wherein the at least one dielectric protrusion in the first opening and the at least one dielectric protrusion in the second opening have a polygonal shape.

4. The method of claim 3, wherein the polygonal shape is selected from the group of polygonal shapes consisting of a square, a rectangle, a pentagon, a triangle, a hexagon, a heptagon, and an octagon.

5. The method of claim 1, wherein the at least one dielectric protrusions in the first and second openings have a circular shape.

6. The method of claim 1, wherein a width of the second portion of the metallization system is less than a width of the first portion of the metallization system.

7. The method of claim 1, wherein the second distance is less than the first distance.

8. The method of claim 1, wherein the step of forming the second portion of the metallization system comprises:
forming a second layer of dielectric material over the semiconductor substrate, the second layer of dielectric material disposed between the first layer of dielectric material and the semiconductor substrate;
forming at least one opening in the second layer of dielectric material; and
forming an electrically conductive material in the at least one opening in the second layer of dielectric material, wherein the electrically conductive material in the at least one opening in the second layer of dielectric material is electrically coupled to the first electrically conductive material.

9. The method of claim 1, wherein the step of forming the second portion of the metallization system comprises:
forming a second layer of dielectric material over the semiconductor substrate, wherein the first layer of dielectric material is disposed between the second layer of dielectric material and the semiconductor substrate;
forming at least one opening in the second layer of dielectric material; and
forming a second electrically conductive material in the at least one opening in the second layer of dielectric material, wherein the second electrically conductive material in the at least one opening in the second layer of dielectric material is electrically coupled to the first electrically conductive material.

10. A method for manufacturing a metallization system capable of precluding stress-induced void formation in a portion thereof, the method comprising:
providing a semiconductor substrate;
forming a first portion of a conductive interconnect over the semiconductor substrate, the first portion having a width, wherein forming the first portion includes:
forming a first layer of dielectric material over the semiconductor substrate; and
forming a first trench in the first layer of dielectric material, the first trench having at least one dielectric pillar;
forming a second portion of the conductive interconnect over the semiconductor substrate, the second portion having a width, wherein forming the second portion includes:
forming a second trench in the first layer of dielectric material, the second trench having at least one dielectric pillar, wherein the first and second trenches are laterally spaced apart from each other; and
disposing a second electrically conductive material in the first and second trenches;
forming a third portion of the conductive interconnect over the semiconductor substrate wherein the third portion is coupled between the first portion and the second portion of the conductive interconnect, wherein said at least one dielectric pillar extends from the first layer of dielectric material only from the bottom of the at least one dielectric pillar.

11. The method of claim 10, wherein forming the third portion of the conductive interconnect comprises:
forming a second layer of dielectric material over the semiconductor substrate, the second layer of dielectric material between the semiconductor substrate and the first layer of dielectric material;
forming at least one trench in the second layer of dielectric material; and
disposing a third electrically conductive material in the at least one trench in the second layer of dielectric material to form a filled trench that serves as the third portion of the conductive interconnect.

12. The method of claim 10, wherein forming the third portion of the conductive interconnect includes:
forming a second layer of dielectric material over the semiconductor substrate, wherein the first layer of dielectric material is between the semiconductor substrate and the second layer of dielectric material;
forming at least one opening in the second layer of dielectric material;
disposing a second electrically conductive material in the at least one opening in the second layer of dielectric material to form a filled opening that serves as the third portion of the conductive interconnect.

13. The method of claim 10, wherein forming the first trench includes forming the at least one dielectric pillar in the first trench having a polygonal shape and wherein forming the second trench includes forming the at least one dielectric pillar in the second trench having a polygonal shape.

14. The method of claim 10, wherein forming the third portion of the conductive interconnect includes:
forming a second layer of dielectric material over the semiconductor substrate;
forming a trench in the second layer of dielectric material; and
disposing a third electrically conductive material in the trench in the second layer of dielectric material.

15. The method of claim 14, wherein the second layer of dielectric material is between the first layer of dielectric material and the semiconductor substrate.

16. The method of claim 14, wherein the first layer of dielectric material is between the second layer of dielectric material and the semiconductor substrate.

17. A method for manufacturing a metallization system capable of precluding stress-induced void formation in a portion thereof, the method comprising:
  providing a semiconductor substrate;
  disposing a first portion of a conductive interconnect over the semiconductor substrate, the first portion having a width;
  disposing second and third portions of the conductive interconnect over the semiconductor substrate, the first and second portions vertically spaced apart from the semiconductor substrate by a first distance and laterally spaced apart from each other, and the third portion vertically spaced apart from the semiconductor substrate by a second distance, the second distance different from the first distance, wherein disposing the first, second, and third portions of the conductive interconnect comprises:
  disposing a first layer of dielectric material over the semiconductor substrate;
  forming first and second trenches in the first layer of dielectric material, the first and second trenches having dielectric pillars formed therein;
  filling the first and second trenches with electrically conductive material to form the first and second portions of the conductive interconnect;
  disposing a second layer of dielectric material over the first and second portions of the conductive interconnect;
  forming a third trench, the third trench in the second layer of dielectric material;
  forming first and second vias in the second layer of dielectric material, the first via exposing the first portion of the conductive interconnect and the second via exposing the second portion of the conductive interconnect; and
  filling the third trench and the first and second vias with an electrically conductive material, wherein the electrically conductive material filling the first via electrically couples the first portion of the conductive interconnect to the third portion of the conductive interconnect and the electrically conductive material filling the second via couples the second portion of the conductive interconnect to the third portion of the conductive interconnect, wherein said dielectric pillars extend from the first layer of dielectric material only from the bottom of the dielectric pillars.

18. The method of claim 17, wherein forming the dielectric pillars includes forming square shaped dielectric pillars.

* * * * *